United States Patent
Haury et al.

(10) Patent No.: US 9,426,913 B2
(45) Date of Patent: Aug. 23, 2016

(54) ASSEMBLY FOR THE ELECTRONIC PROCESSING OF DATA WITH MUTUALIZED RESOURCES

(75) Inventors: Christian Haury, Paris (FR); François Guillot, Paris (FR); Jean-Marie Courteille, Paris (FR)

(73) Assignee: SAGEM DEFENSE SECURITE, Paris (FR)

(*) Notice: Subject to any disclaimer, the term of this patent is extended or adjusted under 35 U.S.C. 154(b) by 246 days.

(21) Appl. No.: 14/004,315

(22) PCT Filed: Apr. 3, 2012

(86) PCT No.: PCT/EP2012/056110
§ 371 (c)(1),
(2), (4) Date: Oct. 16, 2013

(87) PCT Pub. No.: WO2012/136676
PCT Pub. Date: Oct. 11, 2012

(65) Prior Publication Data
US 2014/0029184 A1    Jan. 30, 2014

(30) Foreign Application Priority Data

Apr. 5, 2011 (FR) .................................. 1152941

(51) Int. Cl.
*H05K 7/20* (2006.01)
*H05K 7/00* (2006.01)
*G06F 1/18* (2006.01)
*G06F 1/20* (2006.01)

(52) U.S. Cl.
CPC ............... *H05K 7/005* (2013.01); *G06F 1/182* (2013.01); *G06F 1/183* (2013.01); *G06F 1/20* (2013.01)

(58) Field of Classification Search
CPC ......... H05K 7/005; G06F 1/182; G06F 1/183; G06F 1/20
See application file for complete search history.

(56) References Cited

U.S. PATENT DOCUMENTS

| 7,042,720 | B1 * | 5/2006 | Konshak | G06F 13/409 361/679.33 |
|---|---|---|---|---|
| 7,460,367 | B2 * | 12/2008 | Tracewell | H05K 7/20672 165/104.21 |
| 7,518,862 | B1 * | 4/2009 | Macika | G06F 1/20 361/688 |
| 7,573,715 | B2 * | 8/2009 | Mojaver | G06F 1/181 361/689 |

(Continued)

FOREIGN PATENT DOCUMENTS

| WO | WO 02/33953 A2 | 4/2002 |
| WO | WO 2007/039097 A1 | 4/2007 |

OTHER PUBLICATIONS

PCI Industrial Computer Manufacturers Group: "Packet Switching Backplane Specification," Sep. 5, 2001, 80 pages.

*Primary Examiner* — Anthony Q Edwards
(74) *Attorney, Agent, or Firm* — Muncy, Geissler, Olds & Lowe, P.C.

(57) ABSTRACT

Assembly for the electronic processing of data, comprising a central module and peripheral modules linked to the central module by electrical power supply and data links, the modules comprising: a processing unit, a memory, an input/output unit and an isolation of the power and data links; the central module furthermore comprising an electrical power supply unit for the peripheral modules, a common startup unit shared by the modules, and a star communication interface with the peripheral modules; each peripheral module furthermore comprising a serial link interface to the communication interface of the central module.

14 Claims, 2 Drawing Sheets

(56) References Cited

U.S. PATENT DOCUMENTS

Figure 1:
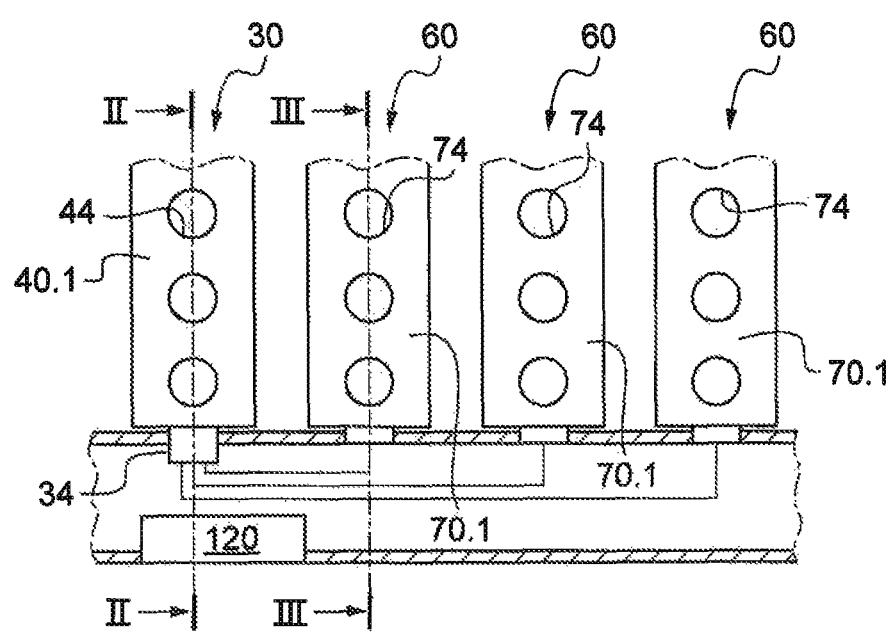

| | | | | |
|---|---|---|---|---|
| 7,826,212 B2* | 11/2010 | Shogan | | G06F 1/20 |
| | | | | 361/679.46 |
| 7,974,093 B2* | 7/2011 | Zeng | | H05K 7/20545 |
| | | | | 165/104.33 |
| 2002/0012236 A1 | 1/2002 | DiMarco | | |
| 2003/0151893 A1* | 8/2003 | Meyer | | H02M 1/44 |
| | | | | 361/688 |
| 2003/0223193 A1* | 12/2003 | Smith | | H05K 7/1488 |
| | | | | 361/679.48 |
| 2006/0185878 A1 | 8/2006 | Soffer | | |
| 2006/0232930 A1* | 10/2006 | Artman | | H05K 7/20736 |
| | | | | 361/695 |
| 2007/0053154 A1* | 3/2007 | Fukuda | | G11B 33/022 |
| | | | | 361/679.33 |
| 2007/0064397 A1* | 3/2007 | Chiba | | G06F 1/1632 |
| | | | | 361/702 |
| 2007/0208961 A1 | 9/2007 | Ghoshal et al. | | |
| 2008/0037218 A1* | 2/2008 | Sharma | | H05K 7/1424 |
| | | | | 361/695 |
| 2008/0266776 A1* | 10/2008 | Peng | | H02G 3/12 |
| | | | | 361/679.4 |
| 2011/0164384 A1* | 7/2011 | Vogel | | F28D 1/024 |
| | | | | 361/696 |
| 2013/0063888 A1* | 3/2013 | Wang | | H05K 7/20736 |
| | | | | 361/679.48 |
| 2013/0147503 A1* | 6/2013 | Kamath | | G06F 1/20 |
| | | | | 324/750.14 |
| 2013/0170134 A1* | 7/2013 | Shih | | H05K 7/20836 |
| | | | | 361/679.48 |
| 2014/0029193 A1* | 1/2014 | Alshinnawi | | G06F 1/20 |
| | | | | 361/679.47 |
| 2014/0078668 A1* | 3/2014 | Goulden | | H05K 7/20736 |
| | | | | 361/679.47 |
| 2014/0133091 A1* | 5/2014 | Shah | | H05K 7/1488 |
| | | | | 361/679.48 |
| 2014/0321056 A1* | 10/2014 | Yoshikawa | | H05K 7/20818 |
| | | | | 361/697 |

* cited by examiner

ASSEMBLY FOR THE ELECTRONIC PROCESSING OF DATA WITH MUTUALIZED RESOURCES

The present invention relates to an assembly for the electronic processing of data with mutualized resources.

Apparatuses are known which comprise a plurality of items of equipment which require, for the operation thereof, to be each linked to a data processing module. Each data processing module comprises: a processing unit like a processor, a memory, an electrical power supply unit, a startup unit, an input-output unit and an interface for serial linking to the linking interface of one or more other modules.

Such an architecture is bulky, heavy and, on the whole, costly.

The first two disadvantages are, furthermore, particularly detrimental for use onboard a vehicle, in particular in the aeronautical field.

An aim of the invention is to overcome at least partially the aforementioned disadvantages.

To this end, an assembly for the electronic processing of data is provided according to the invention, comprising a central module and peripheral modules linked to the central module by power supply and data electrical links, the modules comprising: a processing unit, a memory, an input-output unit and an isolation for the power and data links; the central module furthermore including an electrical power supply unit for the peripheral modules, a common startup unit for the modules, and an interface for star-shaped communication with the peripheral modules; each peripheral module furthermore including an interface for serial linking to the communication interface of the central module.

This architecture allows some of the resources to be mutualized, particularly with regard to the electrical power supply and the start-up of the modules, and also the communication therebetween. This allows multiplication of the corresponding parts to be avoided. Furthermore, the central module can, as a result, be arranged to form the entry point for all the data streams, orchestrate the exchanges, distribute the processing thereof and the storage thereof between the peripheral modules.

Preferably, the communication interface comprises a network of switches.

The switching network, more commonly called "switch fabric", allows better control of the data exchanges.

According to a particular embodiment, the modules are mounted on a support structure including a partitioned bottom receiving the electrical links from the peripheral modules to the central module.

Bringing together the modules particularly facilitates the maintenance operations and further favors the mutualization of components.

Advantageously, the communication interface and the power supply unit for the central module are moved into the partitioned bottom.

This allows for optimization of the space available.

According to a particular feature, at least one of the modules is enclosed in a housing defining at least one air passage between two opposite faces of the housing.

The air passing into said air passage cools the module by convection.

Advantageously then, the air passage is defined between a rear face and a front face of the housing, the passage comprising at least one aperture opening onto the rear face of the housing in order to be in communication with a ventilation unit housed in the partitioned bottom and linked to the central module in order to be controlled thereby.

The ventilation creates a forced convection which improves the cooling of the module.

Preferably, the housing incorporates a thermally conductive frame surrounding the module and being in thermal conduction with at least one dissipating element extending into the air passage.

Cooling of the module is further improved by the frame capturing the calories given off by the module and bringing them, by conduction, into the air channel via the dissipating element which is, for example, a heat sink, a heat pipe, a radiator, etc.

According to an additional feature, at least one of the modules is enclosed in a housing made from composite material.

Such a housing has a large dielectric strength contributing to the electrical insulation of the module.

Advantageously, the power supply unit is arranged to deliver at least a high-frequency alternating current and each peripheral module comprises a current-converting unit.

The resistance to lightning can therefore be improved, which is decisive for use in an aircraft.

Other features and advantages of the invention will emerge upon reading the following description of a particular non-limiting embodiment of the invention.

Figure 2:
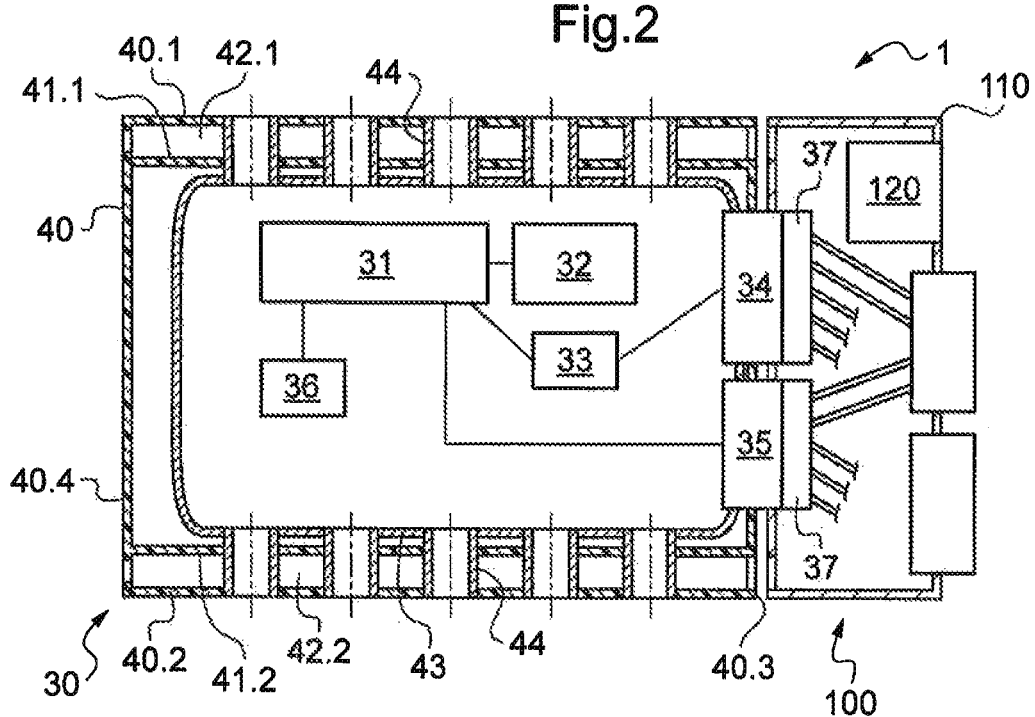
Figure 3:
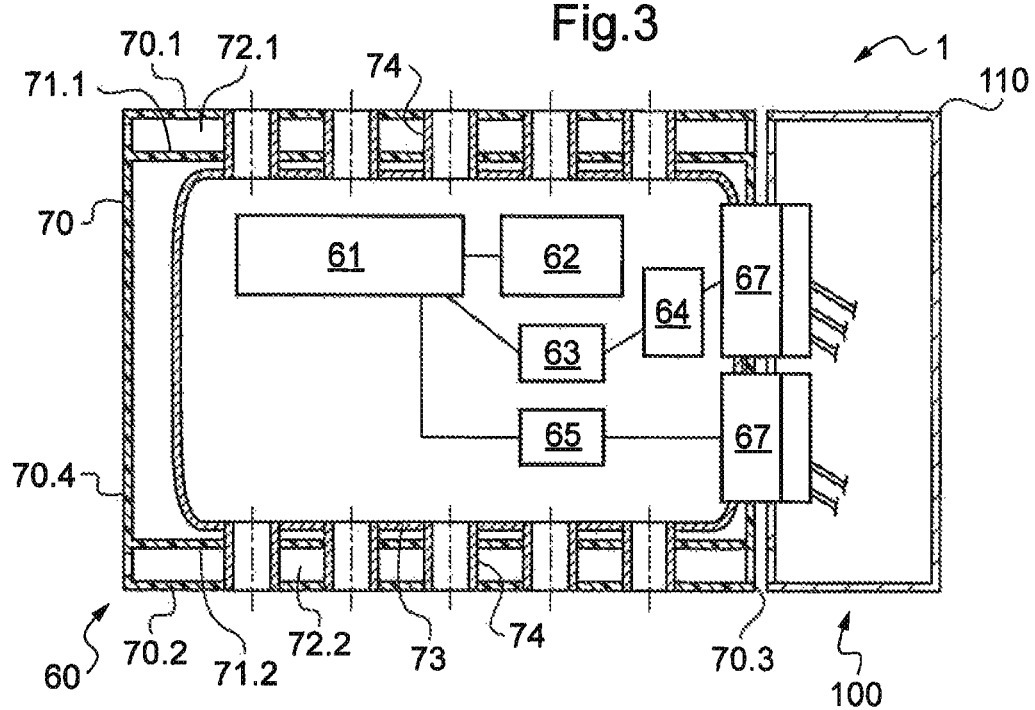

Reference will be made to the appended drawings wherein:

FIG. 1 is a cutaway top partial schematic view of an assembly in accordance with the invention, FIG. 2 is a schematic view of this assembly in section along the line II-II of FIG. 1, FIG. 3 is a schematic view of this assembly in section along the line III-III of FIG. 1.

With reference to the figures, the assembly for the electronic processing of data in accordance with the invention, generally designated 1, comprises a central module, generally designated 30, and peripheral modules, each with the general reference 60, which are linked to the central module 30 by electrical links.

The central module 30 includes a processing unit 31, such as a processor, a memory 32, and more precisely a RAM memory and a ROM memory, and an input-output unit 33. The central module 30 is a computer module, the processor of which is arranged to execute programs contained in the memory 32, these programs including an operating system and applications. The operating system is, in this case, arranged in a manner known per se to manage the application execution by several processors and the recording and reading of data on several memories. The operating system furthermore manages the data coming from the input-output unit 33 which is linked, for example, to sensors, data input peripherals such as a keyboard, a pointing device, output peripherals such as a screen, a printer, etc. The input-output unit 33 is, furthermore, linked to a star-shaped communication interface 34 for with the peripheral modules 60. The communication interface 34 comprises a switching network or "switch fabric".

The central module 30 further includes an electrical power supply unit 35 for the central module 30 and peripheral modules 60 and a shared startup unit 36 for the modules 30, 60, The power supply unit 35 is arranged to deliver at least a high-frequency alternating current.

Each peripheral module 60 comprises a processing unit 61, such as a processor, a memory 62, and more precisely a RAM memory and a ROM memory, and an input-output unit 63. The peripheral module 60 is a computer module, the processor of which is arranged to execute programs contained in the memory 62, these programs including an operating system and applications. The operating system furthermore manages the data coming from the input-output unit 63 which is linked, for example, to sensors, data input peripherals like a keyboard, a pointing device, output peripherals like a screen, a printer, etc. The input-output unit 63 is further linked to an interface 64 for linking to the star-shaped communication interface 34. The peripheral modules 60 are arranged like slave modules to the central module 30 which is the master module.

Each peripheral module 60 includes a current-converting unit 65 linked to the power supply unit 35. The current-converting unit 65 transforms the high-frequency AC current coming from the power supply unit 35 into direct current suitable for the peripheral module 60 concerned. The conversion unit 65 receives a 115 VAC current and incorporates a PFC circuit and reinforced DC/AC galvanic isolation.

The star-shaped communication interface 34 provides point-to-point differential serial linking from each peripheral module 60 to the central module 30. This serial link is a high speed link. The modules 30, 60 are arranged to communicate by means of ETHERNET, and more precisely ETHERNET/TTE ("Time Triggered Ethernet"), protocol.

The electric circuit of each module 30, 60 is arranged to have a floating electrical reference which is specific thereto.

The links from the peripheral modules 60 to the central module 30 are isolated both as regards the links for transferring power and as regards the links for transferring data. The isolation is, for example, a galvanic isolation by means of a transformer or an optical isolation in accordance with the ARINC 818 standard for aeronautical uses, particularly with regard to ETHERNET links.

The modules 30, 60 are each enclosed in a housing 40, 70 made from composite material. Each housing 40, 70 has a substantially peripheral shape and comprises an upper wall 40.1 and a lower wall 40.2 having apertures to allow natural convection in the housing 40, 70.

Each housing 40, 70 further comprises two partitions 41.1, 42.2, 71.1, 72.2 extending in parallel and proximate the walls 40.1, 40.2, 70.1, 70.2 to define two air passages 42.1, 42.2, 72.1, 72.2 between a rear wall 40.3, 70.3 and a front wall 40.4, 70.4 of the housing 40, 70, The air passages 42.1, 42.2, 72.1, 72.2 open to the outside via apertures provided on the walls 40.3, 40.4, 70.3, 70.4.

Each housing 40, 70 incorporates a thermally conductive frame 43, 73 surrounding the module 40, 70 and being in thermal conduction with dissipating elements extending into the air passages 42.1, 42.2, 72.1, 72.2. The dissipating elements are heat pipes 44, 74 each passing through the passage 42.1, 42.2, 72.1, 72.2, the wall 40.1, 40.2, 70.1, 70.2 and the partition 41.1, 41.2, 71.1, 71.2 defining the passage in question, and finally the frame 43, 73. The heat pipes 44, 74 are tubes made from thermally conductive material which are welded to the frame 43, 73 and allow a passage of air between the outside of the housing 40, 70 and the module 30, 60, through the lower face 40.2, 70.2 and, through the upper face 40.1, 70.1 of the housing 40, 70 depending on the arrangement of the heat pipe.

The modules 30, 60 are mounted on a support structure 100 including a partitioned bottom 110 receiving the electrical links from the peripheral modules 60 to the central module 20. The housings 40, 70 of the modules 30, 60 are fixed in the support structure 100 such that the housings are attached to one another by the lateral faces thereof and the rear faces 40.3, 70.3 extend facing the partitioned bottom 110.

The communication interface 34 and the power supply unit 35 of the central module 30 are moved into the partitioned bottom 110.

A ventilation unit 120 is housed in the partitioned bottom 110 and connected to the central module 30 in order to be controlled thereby. Temperature sensors are placed, to this end, in the partitioned wall 110 and connected to the central module 30.

The partitioned bottom 110 includes apertures facing the rear walls 40.3, 70.3 in order to connect with the passages 41.1, 41.2, 71.1, 71.2 such that the ventilation unit 120 blows air into the passages 41.1, 41.2, 71.1, 71.2. The frame 43, 73 captures the calories given off during the operation of the module with which it is associated. The calories are led to the heat pipes 44, 74 before being evacuated by the air flowing in the passages 41.1, 41.2, 71.1, 71.2.

Therefore, there is natural convection between the lower and upper faces and forced convection between the rear and front faces.

It is evident that the heat sinking means are particularly useful for power modules and those including electromechanical, components. The heat sinking is, for example, calculated to evacuate 50 W per module. Therefore, the ventilation means are mutualized.

This architecture and the programming of the modules are arranged to allow the computational and memory resources to be shared out over all or some of the modules. The central module 30 is arranged to orchestrate the exchanges, and is the point of entry for all of the streams for loading, controlling and communication buses.

Of course, the invention is not limited to the embodiments described but covers any alternative falling within the scope of the invention as defined by the claims.

In particular, other cooling means can be envisaged and particularly other dissipating means heat sink, heat pipe, radiator, microturbine, etc. It is possible to only provide natural ventilation or forced ventilation. The frames can be omitted. The housings can comprise only a single passage, or none at all.

The housings can be made from other materials and have other shapes.

The support structure can be arranged to support the modules vertically or using a non-linear organization.

The communication protocols and the data transfer links can be different to those described.

The invention claimed is:

1. An assembly for the electronic processing of data, comprising a central module and peripheral modules linked to the central module by power supply and data electrical links, the modules comprising: a processing unit, a memory, an input-output unit and an isolation for the power and data links; the central module furthermore including an electrical power supply unit for the peripheral modules, a common startup unit for the modules, and an interface for star-shaped communication with the peripheral modules; each peripheral module furthermore including an interface for serial linking to the communication interface of the central module.

2. The assembly as claimed in claim 1, wherein the communication interface comprises a network of switches.

3. The assembly as claimed in claim 1, wherein the modules are mounted on a support structure including a partitioned bottom receiving the electrical links from the peripheral modules to the central module.

4. The assembly as claimed in claim 3, wherein the communication interface and the power supply unit for the central module are moved into the partitioned bottom.

5. The assembly as claimed in claim 3, wherein at least one of the modules is enclosed in a housing defining at least one air passage between two opposite faces of the housing.

6. The assembly as claimed in claim 5, wherein the air passage is defined between a rear face and a front face of the housing, the passage comprising at least one aperture opening onto the rear face of the housing in order to be in communication with a ventilation unit housed in the partitioned bottom and linked to the central module in order to be controlled thereby.

7. The assembly as claimed in claim 6, wherein the housing incorporates a thermally conductive frame surrounding the module and being in thermal conduction with at least one dissipating element, extending into the air passage.

8. The assembly as claimed in claim 7, wherein the dissipating element is a heat pipe passing through the passage, an adjacent outer wall of the housing and the frame.

9. The assembly as claimed in claim 8, wherein the heat pipe allows a passage of air between a lower face and an upper face of the housing.

10. The assembly as claimed in claim 3, wherein at least one of the modules is enclosed in a housing made from composite material.

11. The assembly as claimed in claim 1, wherein the power supply unit is arranged to deliver at least a high-frequency alternating current and each peripheral module comprises a current-converting unit.

12. The assembly as claimed in claim 1, wherein each module is arranged to have a floating electrical reference which is specific thereto.

13. The assembly as claimed in claim 1, wherein the modules are arranged to communicate therebetween using an ETHERNET protocol.

14. The assembly as claimed in claim 1, wherein the isolation is a galvanic isolation.

\* \* \* \* \*